(12) United States Patent
Ishii (10) Patent No.: US 10,607,837 B2
(45) Date of Patent: Mar. 31, 2020

(54) GAS FLOW CONTROL FOR EPI THICKNESS UNIFORMITY IMPROVEMENT

(71) Applicant: Applied Materials, Inc., Santa Clara, CA (US)

(72) Inventor: Masato Ishii, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/682,171

(22) Filed: Aug. 21, 2017

(65) Prior Publication Data

US 2018/0053653 A1 Feb. 22, 2018

Related U.S. Application Data

(60) Provisional application No. 62/377,201, filed on Aug. 19, 2016.

(51) Int. Cl.
| | |
|---|---|
| *C23C 16/455* | (2006.01) |
| *H01L 21/205* | (2006.01) |
| *H01L 21/67* | (2006.01) |
| *H01L 21/02* | (2006.01) |
| *H01L 21/268* | (2006.01) |

(52) U.S. Cl.
CPC ...... *H01L 21/2053* (2013.01); *C23C 16/4558* (2013.01); *C23C 16/45504* (2013.01); *H01L 21/67115* (2013.01); *H01L 21/0262* (2013.01); *H01L 21/02211* (2013.01); *H01L 21/02216* (2013.01); *H01L 21/02532* (2013.01); *H01L 21/2686* (2013.01); *H01L 21/67207* (2013.01); *H01L 21/67253* (2013.01)

(58) Field of Classification Search
USPC ...................................................... 438/503
See application file for complete search history.

(56) References Cited

U.S. PATENT DOCUMENTS

| | | | |
|---|---|---|---|
| 6,902,622 B2 | 6/2005 | Johnsgard et al. | |
| 2012/0240853 A1* | 9/2012 | Carlson | C23C 16/4404 118/715 |
| 2015/0147484 A1* | 5/2015 | Nguyen | C23C 16/36 427/535 |
| 2016/0068956 A1 | 3/2016 | Lau et al. | |
| 2017/0011904 A1 | 1/2017 | Cho et al. | |

FOREIGN PATENT DOCUMENTS

JP 2004111857 * 4/2004

* cited by examiner

*Primary Examiner* — Timor Karimy
(74) *Attorney, Agent, or Firm* — Patterson + Sheridan LLP (57) ABSTRACT

One implementation provides a method including providing a substrate into a processing chamber through a loading port, rotating the substrate clockwise, providing a gas mixture into a processing region through an inject insert comprising a first, second, and third sets of inject inlets, wherein the first set of inject inlets creates an inner zone inside the processing region, the second set of inject inlets creates a middle zone radially outward of the inner zone, and the third set of inject inlets creates an outer zone radially outward the middle zone, the gas mixture is provided by flowing the gas mixture through the first and second sets of inject inlets, and inject inlets of the third set of inject inlets that are away from the loading port, while blocking flow of the gas mixture into inject inlets of the third set of inject inlets that are closer to the loading port.

20 Claims, 5 Drawing Sheets

FIG. 5

GAS FLOW CONTROL FOR EPI THICKNESS UNIFORMITY IMPROVEMENT

CROSS-REFERENCE TO RELATED APPLICATIONS

This application claims priority to U.S. provisional patent application Ser. No. 62/377,201, filed Aug. 19, 2016, which is herein incorporated by reference.

BACKGROUND

Field

Implementations of the disclosure generally relate to improved processes for an epitaxial deposition chamber utilized in semiconductor fabrication processes.

Description of the Related Art

Modern processes for manufacturing semiconductor devices require precise adjustment of many process parameters to achieve high levels of device performance, product yield, and overall product quality. For processes that include the formation of semiconductive layers on substrates with epitaxial ("EPI") film growth, numerous process parameters have to be carefully controlled, including the substrate temperature, the pressures and flow rates precursor materials, the formation time, and the distribution of power among the heating elements surrounding the substrate, among other process parameters.

There is an ongoing need for increasing yield of devices, as well as the number of devices, per substrate. Utilization of substrates with a larger surface area for device formation increases the number of devices per substrate. However, increasing the surface area of the substrate creates numerous process parameter issues. For example, mere scaling-up of chamber components to accommodate larger substrate sizes has been found to not be sufficient to achieve desirable results.

Thus, there is a need for an improved process for uniform deposition of semiconductive layers on a substrate having a larger usable surface area.

SUMMARY

Implementations of the disclosure generally relate to improved processes for an epitaxial deposition chamber utilized in semiconductor fabrication processes. In one implementation, a method for processing a substrate in a processing chamber is provided. The method includes providing a substrate onto a substrate support disposed within a processing region of the processing chamber through a substrate loading port, wherein the processing chamber comprises a gas inlet, and a gas outlet disposed opposing the gas inlet, and the gas inlet, the gas outlet, and the substrate loading port are angularly offset at about 90 degrees with respect to each other, rotating the substrate in a clockwise direction, providing a gas mixture into the processing region through a gas inject insert, the gas inject insert comprising a first set of inject inlets, a second set of inject inlets, and a third set of inject inlets, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, and the outer injection zone is coaxial with the middle injection zone and the inner injection zone, wherein the gas mixture is provided into the processing region by flowing the gas mixture through the first set of inject inlets, the second set of inject inlets, and inject inlets of the third set of inject inlets that are disposed away from the substrate loading port, while blocking flow of the gas mixture into inject inlets of the third set of inject inlets that are disposed closer to the substrate loading port.

In another implementation, the method includes providing a substrate onto a substrate support disposed within a processing chamber, the processing chamber comprising an upper dome and a lower dome opposing the upper dome, a base ring disposed between the upper dome and the lower dome, wherein the base ring comprises a substrate loading port, a gas inlet, and a gas outlet disposed opposing the gas inlet, and gas inlet, the gas outlet and the substrate loading port are angularly offset at about 90 degrees with respect to each other, a liner assembly disposed adjacent to the base ring, the liner assembly having an inject insert comprising a first set of inject inlets, a second set of inject inlets, and a third set of inject inlets, wherein the first set of inject inlets are positioned to create an inner injection zone inside a processing region of the processing chamber, the second set of inject inlets are positioned to create a middle injection zone that is radially outward of the inner injection zone, and the third set of inject inlets are positioned to create an outer injection zone that is radially outward the middle injection zone, rotating the substrate in a clockwise direction, and flowing into the processing region a gas mixture through the first set of inject inlets, the second set of inject inlets, and inject inlets of the third set of inject inlets that are disposed away from the substrate loading port, while blocking flow of the gas mixture into inject inlets of the third set of inject inlets that are disposed closer to the substrate loading port.

In yet another implementation, the method includes providing a substrate onto a substrate support disposed within a processing region of a processing chamber, the processing chamber comprising a radiant energy assembly comprising a plurality of radiant energy sources, a dome assembly, at least a portion of which is positioned between the substrate support and the radiant energy assembly, the dome assembly comprising an upper dome and a lower dome, a base ring disposed between the upper dome and the lower dome, the base ring comprising a substrate loading port, a gas inlet, and a gas outlet disposed opposing the gas inlet, and the substrate loading port, the gas inlet and the gas outlet are angularly offset at about 90 degrees with respect to each other, a liner assembly disposed within an inner circumference of the base ring, the liner assembly comprising an inject insert comprising a first set of inject inlets, a second set of inject inlets, and a third set of inject inlets, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone is coaxial with the middle injection zone and the inner injection zone, rotating the substrate in a clockwise direction, and flowing a gas mixture through the first set of inject inlets, the second set of inject inlets, and inject inlets of the third set of inject inlets that are disposed away from the substrate loading port, while blocking flow of the gas mixture into inject inlets of the third set of inject inlets that are disposed closer to the substrate loading port.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Figure 1:
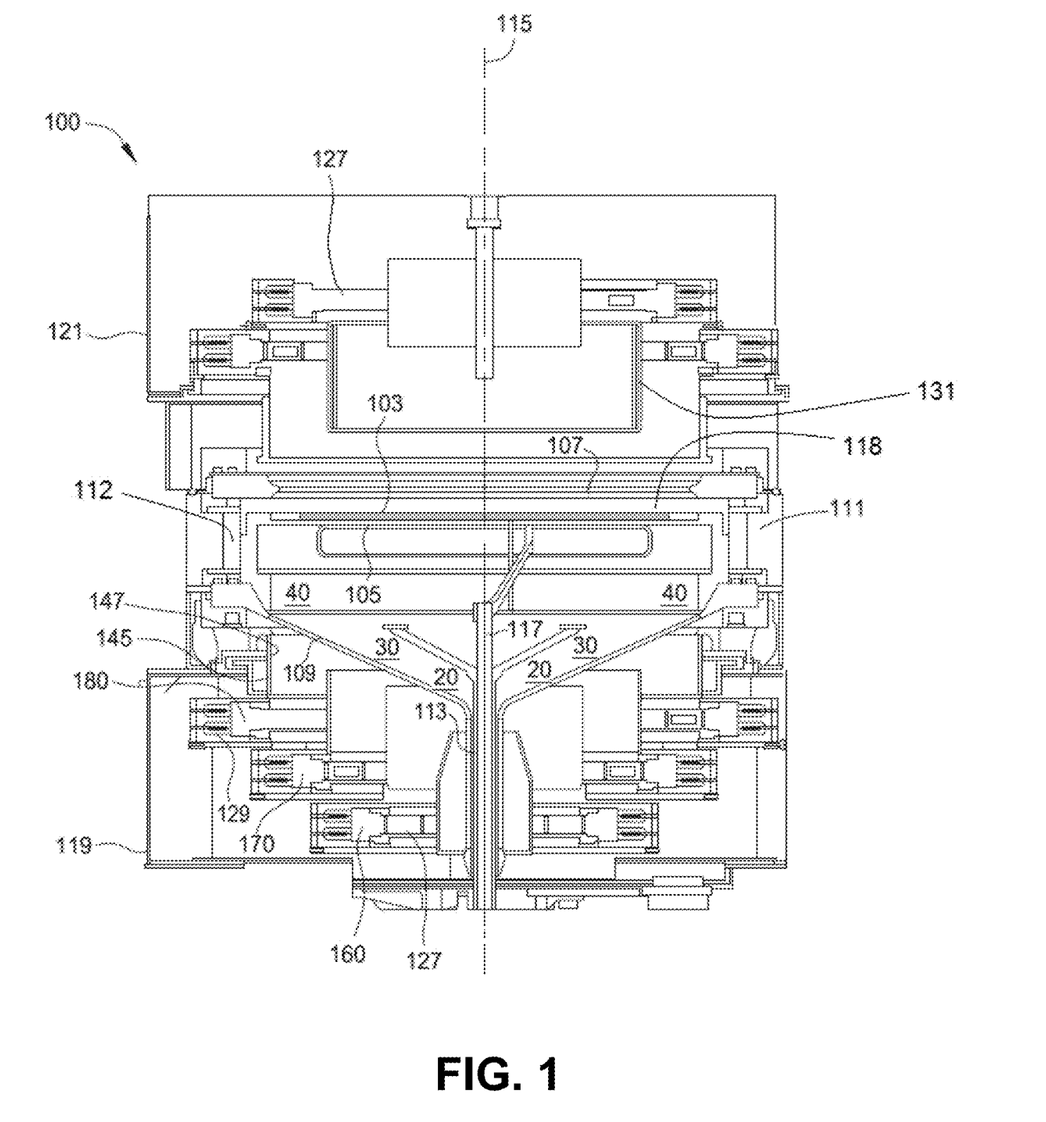
FIG. 1 illustrates a schematic sectional view of an epitaxial deposition chamber that may be used to practice various implementations of the present disclosure.

FIG. 1 illustrates a schematic sectional view of an epitaxial deposition chamber 100 that may be used to practice various implementations of the present disclosure. While the epitaxial deposition chamber is shown, other chambers such as a chemical vapor deposition chamber or a rapid thermal processing chamber can also be benefited by implementations of the present disclosure. A substrate 103, which might be a thin wafer of silicon having a diameter of 200 mm, 300 mm, or 450 mm, for example, is supported on a substrate support 105 mounted within the chamber within the chamber 100. Substrate support 105 may be made, for example, of graphite, silicon carbide or graphite coated with silicon carbide. Substrate support 105 may have a diameter larger than the diameter of the substrate to be processed. Thus, for a 450 mm substrate, the substrate support 105 would have a diameter greater than or equal to about 450 mm. Representative diameters could be between 460 mm to 550 mm.

The substrate support 105 may be seem to include three regions, namely: a central region 20, a periphery region 40, and a mid-radius region 30. These regions are concentric and symmetrical about symmetric axis 115. Central region 20 describes a circular area in the center-most portion of substrate support 105. Periphery region 40 describes an annular area along the outer edge of substrate support 105. Mid-radius region 30 describes an annular area approximately half-way between the center and the edge of substrate support 105 which is bounded by the outer most boundary of central region 20 and the center most boundary of periphery region 40. Although described in relation to a substrate support 105, central region 20, mid-radius region 30 and periphery region 40 are applicable to a substrate 103 disposed on a substrate support 105 as in, for example, during processing operations within chamber 100.

An upper window 107 made of a transparent material such as quartz, for example, encloses the top surface of substrate 103 and substrate support 105 while a lower window 109 encloses the bottom surface thereof. Base ring 111, illustrated in a simplified schematic form, is used to join upper and lower windows 107 and 109 forming a gas-tight joint. One or more gases supplied from a gas supply source are introduced into a processing region 118 through a gas inlet (not shown) formed in the sidewall of the base ring 111. The gas inlet is in fluid communication with the processing region 118 via a plurality of inject inlets formed through a liner assembly 112. The liner assembly 112 may be disposed adjacent to the base ring 111, for example the liner assembly 112 may be disposed within or surrounded by an inner circumference of the base ring 111. An opening may be disposed through the liner assembly 112 and aligned with a substrate loading port of the base ring. The substrate loading port is obscured by the substrate support 105 in the view of FIG. 1. The substrate loading port allows for passage of the substrate 103 into the epitaxial deposition chamber 100.

In operation, the substrate 103 is brought into the epitaxial deposition chamber 100 and positioned onto the substrate support 105 through the substrate loading port. The process and cleaning/purging gases are then provided into chamber 100 to the inject inlets of the liner assembly 112 via gas inlets formed within base ring 111. Specifically, gases enter the processing region 118 via the inject inlets on one side of chamber 100, flow across substrate support 105 and substrate 103 in a substantially laminar flow and then exit via an exhaust port opposite to the inject inlets. The term "opposite", as used herein, is defined in mathematical terms such that A is opposite to B with respect to a reference plane P extending between A and B. Opposite is intended generally and thus does not require that A and B be exactly opposite, unless expressly stated. The substrate loading port, the inject inlets, and the exhaust port may be aligned to each other and disposed at substantially the same level. For example, the substrate loading port may be positioned on a plane intersecting the inject inlets and the exhaust port. In one implementation, the substrate loading port, the inject inlets, and the exhaust port are angularly offset at about 90 degrees with respect to each other.

A support shaft 117 extends upwardly within the neck 113 of lower window 109 along axis 115 which is attached to and supports the substrate support 105. Shaft 117 and substrate support 105 may be rotated during processing operations by a motor (not shown). One exemplary rotation speed may be about 20 RPM (revolutions per minute) to about 50 RPM, for example about 32 RPM.

The reactor heater system of chamber 100 comprises a lower heat source 119 and an upper heat source 121. Upper 121 and lower 119 heat sources are positioned adjacent to upper window 107 and lower window 109 covers respectively for the purpose of heating substrate 103 and substrate support 105 during processing operations conducted within chamber 100. The upper heat source 121 includes a reflector 131, which is generally a cylindrical body used to increase the effectiveness and directivity of arrays of radiant lamps 127. Lower heat source 119 comprises an inner array 160 of radiant lamps 127, an outer array 180 of radiant lamps 127, and an intermediate array 170 of radiant lamps 127 disposed between the inner array 160 and outer array 180. Radiant lamps 127 may be any suitable heating element capable of heating the substrate 103 to a temperature within a range of about 200 degrees Celsius to about 1600 degrees Celsius. Electrical interfacing for radiant lamps 127 is provided by sockets 129. Inner array 160, intermediate array 170, and outer array 180 are in a concentric, annular arrangement, and each has radiant lamps equally spaced apart around the circumference of the chamber 100. Inner, intermediate, and outer arrays of radiant lamps 127 are disposed within planes substantially parallel to but vertically disposed from substrate 103 and substrate support 105, creating the radiant energy assembly.

Lower heat source 119 also includes a plurality of reflectors, such as an outer reflector 145, which provides for mechanical attachment of radiant lamps 127 as well as reflective surface 147 to enhance directivity of radiation generated by radiant lamps 127 within outer array 180. Reflectors may be formed from a rigid, thermally durable material such as aluminum, stainless steel or brass. Additionally, the reflective surfaces of outer reflector 145 may be coated with a material having good reflective qualities for radiation such as gold or copper.

Figure 2:
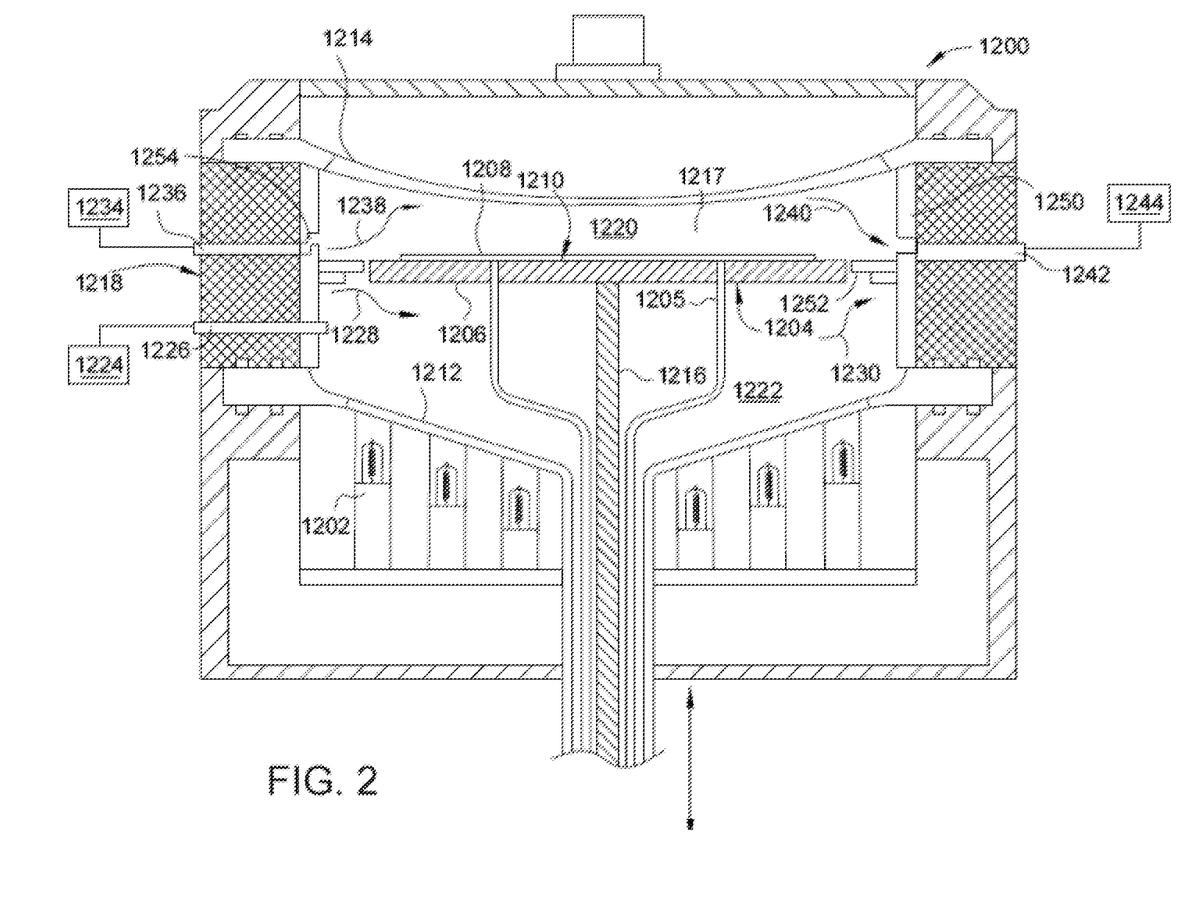
FIG. 2 illustrates a schematic sectional view of a heating process chamber that may be used to practice various implementations of the present disclosure.

FIG. 2 illustrates a schematic sectional view of a heating process chamber 1200 that may be used to practice various implementations of the present disclosure. In one example, this can be a backside heating process chamber. One example of a process chamber that may be adapted to benefit from the implementations described herein is an Epi process chamber, which is available from Applied Materials, Inc., located in Santa Clara, Calif. It is contemplated that other processing chambers, including those from other manufacturers, may be adapted to practice the present implementations.

The process chamber 1200 may be used to process one or more substrates, including the deposition of a material on an upper surface of a substrate 1208. The process chamber 1200 can include a process chamber heating device, such as an array of radiant lamps 1202 for heating, among other components, a back side 1204 of a substrate support 1206 or the back side of the substrate 1208 disposed within the process chamber 1200. The substrate support 1206 may be a disk-like substrate support 1206 as shown, or may be a ring-like substrate support, which supports the substrate from the edge of the substrate or may be a pin-type support which supports the substrate from the bottom by minimal contact posts or pins.

In this implementation, the substrate support 1206 is depicted as located within the process chamber 1200 between an upper dome 1214 and a lower dome 1212. The upper dome 1214 and the lower dome 1212, along with a base ring 1218 that is disposed between the upper dome 1214 and lower dome 1212, can define an internal region of the process chamber 1200. The substrate 1208 can be brought into the process chamber 1200 and positioned onto the substrate support 1206 through a substrate loading port, which is obscured by the substrate support 1206 in the view of FIG. 2.

The base ring 1218 can generally include the substrate loading port, a process gas inlet 1236, and a gas outlet 1242. The base ring 1218 may have a generally oblong shape with the long side on the substrate loading port and the short sides on the process gas inlet 1236 and the gas outlet 1242, respectively. The base ring 1218 may have any desired shape as long as the substrate loading port, the process gas inlet 1236 and the gas outlet 1242 are angularly offset at about 90 degrees with respect to each other. For example, the substrate loading port may be located at a side between the process gas inlet 1236 and the gas outlet 1242, with the process gas inlet 1236 and the gas outlet 1242 disposed at opposing one another on the base ring 1218. In various implementations, the substrate loading port, the process gas inlet 1236 and the gas outlet 1242 are aligned to each other and disposed at substantially the same level with respect to a basis plane of the chamber 1200. For example, the substrate loading port may be positioned on a plane intersecting the process gas inlet 1236 and the gas outlet 1242. The term "opposite", as used herein, is defined in mathematical terms such that A is opposite to B with respect to a reference plane P extending between A and B. Opposite is intended generally and thus does not require that A and B be exactly opposite, unless expressly stated.

The substrate support 1206 is shown in an elevated processing position, but may be vertically translated by an actuator (not shown) to a loading position below the processing position to allow lift pins 1205 to contact the lower dome 1212, extend through holes in the substrate support 1206 and along a central shaft 1216, and raise the substrate 1208 from the substrate support 1206. A robot (not shown) may then enter the process chamber 1200 to engage and remove the substrate 1208 therefrom though the substrate loading port. The substrate support 1206 then may be actuated up to the processing position to place the substrate 1208, with its device side 1217 facing up, on a front side 1210 of the substrate support 1206.

The substrate support 1206, while located in the processing position, divides the internal volume of the process chamber 1200 into a processing region 1220 that is above the substrate, and a purge gas region 1222 below the substrate support 1206. The substrate support 1206 can be supported and rotated during processing by the central shaft 1216 to facilitate uniform processing of the substrate 1208. One exemplary rotation speed may be about 20 RPM (revolutions per minute) to about 50 RPM, for example about 32 RPM.

In general, the central window portion of the upper dome 1214 and the bottom of the lower dome 1212 are formed from an optically transparent material such as quartz. The thickness and the degree of curvature of the upper dome 1214 may be configured to manipulate the uniformity of the flow field in the process chamber.

The lamps 1202 can be disposed adjacent to and beneath the lower dome 1212 in a manner around the central shaft 1216 to independently control the temperature at various regions of the substrate 1208 as the process gas passes over, thereby facilitating the deposition of a material onto the upper surface of the substrate 1208. The lamps 1202 may be used to heat the substrate 1208 to a temperature within a range of about 200 degrees Celsius to about 1600 degrees Celsius. While not discussed here in detail, the deposited material may include silicon, doped silicon, germanium, doped germanium, silicon germanium, doped silicon germanium, gallium arsenide, gallium nitride, or aluminum gallium nitride.

Process gas supplied from a process gas supply source 1234 is introduced into the processing region 1220 through a process gas inlet 1236 formed in the sidewall of the base ring 1218. The process gas inlet 1236 connects to the process gas region through a plurality of gas passages 1254 formed through a liner assembly 1250. The liner assembly 1250 may be disposed adjacent to the base ring 1218, for example the liner assembly 1250 may be disposed within or surrounded by an inner circumference of the base ring 1218. An opening may be disposed through the liner assembly 1250 and aligned with the substrate loading port to allow for passage of the substrate 1208. The process gas inlet 1236, the liner assembly 1250, or combinations thereof, are configured to direct the process gas in a direction which can be generally radially inward.

The process gas exits the processing region 1220 (along the flow path 1240) through a gas outlet 1242 located on the opposite side of the process chamber 1200 as the process gas inlet 1236. Removal of the process gas through the gas outlet 1242 may be facilitated by a vacuum pump 1244 coupled thereto.

Purge gas supplied from a purge gas source 1224 is introduced to the purge gas region 1222 through a purge gas inlet 1226 formed in the sidewall of the base ring 1218. The purge gas inlet 1226 connects to the process gas region through the liner assembly 1250. The purge gas inlet 1226 is disposed at an elevation below the process gas inlet 1236. If the circular shield 1252 is used, the circular shield 1252 may be disposed between the process gas inlet 1236 and the purge gas inlet 1226. In either case, the purge gas inlet 1226 is configured to direct the purge gas in a generally radially inward direction. During the film formation process, the substrate support 1206 is located at a position such that the purge gas flows down and round along flow path 1228 across back side 1204 of the substrate support 1206. The purge gas exits the purge gas region 1222 (along flow path 1230) and is exhausted out of the process chamber through the gas outlet 1242 located on the opposite side of the process chamber 1200 as the purge gas inlet 1226.

Exemplary Inject Inserts

Figure 3A:
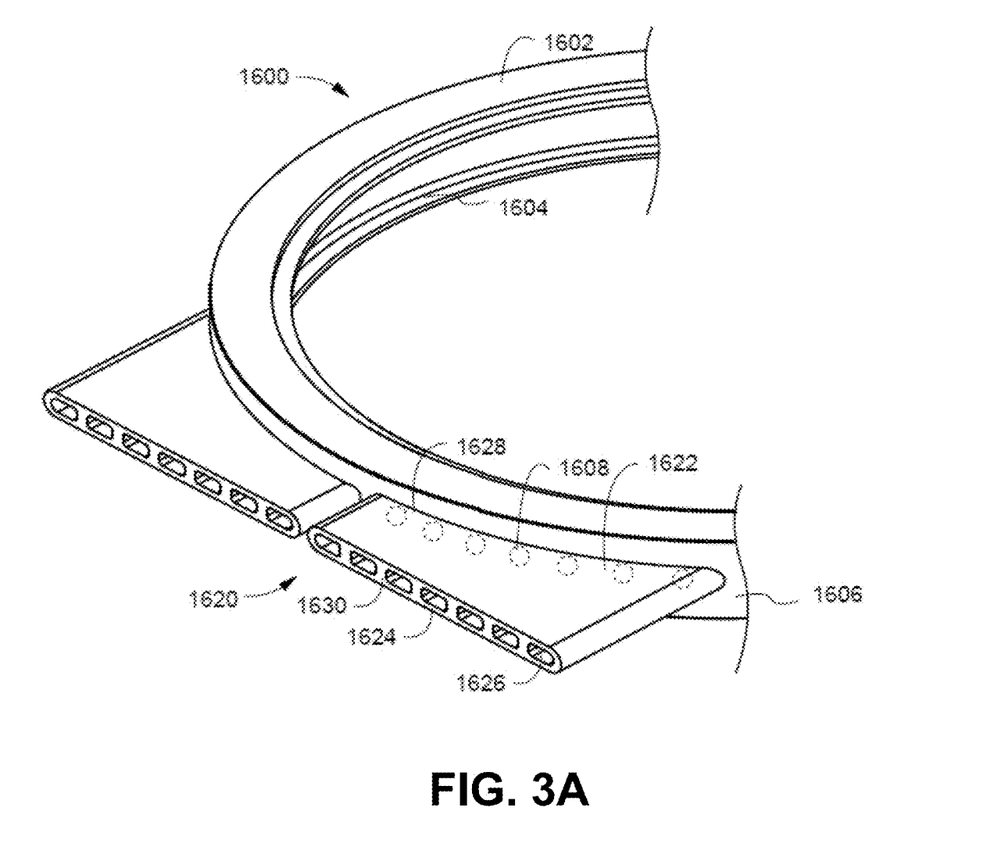
FIGS. 3A and 3B depict a liner assembly with an inject insert that may be used to practice various implementations of the present disclosure.
Figure 3B:
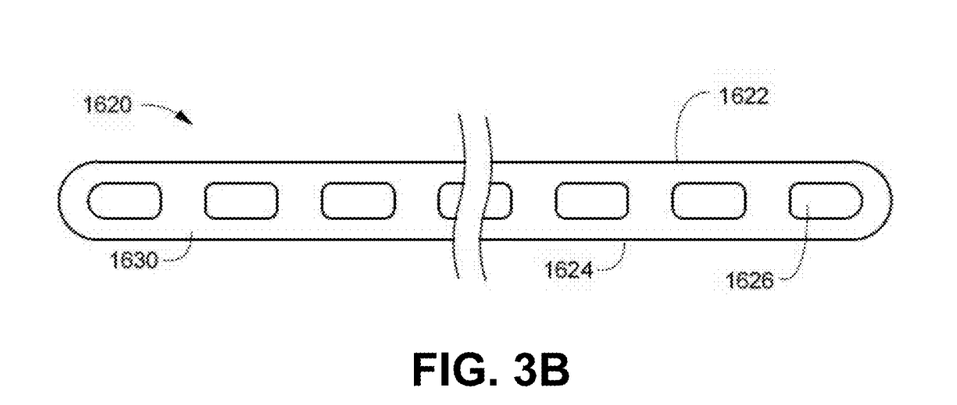

FIGS. 3A and 3B depict a liner assembly 1600 with an inject insert 1620 that may be used to practice various implementations of the present disclosure. The liner assembly 1600 may be used in place of the liner assembly 112 or the liner assembly 1250 shown in the epitaxial deposition chamber 100 (FIG. 1) or the heating process chamber 1200 (FIG. 2). FIG. 3A depicts a perspective view of the inject insert 1620 in connection with a liner assembly 1600. FIG. 3B depicts a side view of the inject insert 1620. The liner assembly 1600 includes a liner body 1602 with an inner surface 1604 and an outer surface 1606. The inner surface 1604 forms the boundaries of a processing region, such as the processing region 112 described with reference to FIG. 1, or the processing region 1220 described with reference to FIG. 2. A plurality of liner inlets 1608, which are depicted as dashed line circles, are formed through the inner surface 1604 and outer surface 1606 of the liner body 1602. The inject insert 1620, shown here with two inject inserts 1620, is fluidly connected with the plurality of liner inlets 1608. Gas supplied from a gas supply source is introduced into the processing region, through the inject insert 1620 and then through the plurality of liner inlets 1608, whereby the plurality of liner inlets 1608 can deliver one or more individual gas flows. The inject insert 1620, the plurality of liner inlets 1608 or both may be configured to provide individual gas flows with varied parameters, such as velocity, density, or composition. The plurality of liner inlets 1608 are configured to direct the process gas in a generally radially inward direction, with the gas being delivered to a central area of the processing region. Each of the plurality of liner inlets 1608 and the inject insert 1620 may be used, individually or in combination, to adjust one or more parameters, such as velocity, density, direction and location, of the gas from the gas supply source.

The inject insert 1620 can be formed from a single piece of metal, ceramic or otherwise inert composition, such as aluminum or quartz. The inject insert 1620 can have a substantially planar upper surface 1622 and a substantially planar lower surface 1624. The inject insert 1620 can have a number of inject ports 1626 formed therein. The end portions of the inject insert 1620 are shown here, with the middle portions omitted for simplicity. In this implementation, the inject insert 1620 is depicted as having seven (7) inject ports 1626. The inject ports 1626 may be of any shape or size, such that the flow rate, flow velocity and other flow parameters may be controlled. Further, multiple inject ports 1626 may connect with any number of the plurality of liner inlets 1608. In one implementation, a single port of the plurality of liner inlets 1608 is served by more than one of the inject ports 1626. In another implementation, a multiple ports of the plurality of liner inlets 1608 is served by a single port of the inject ports 1626. The inject insert 1620 has a connecting surface 1628. The connecting surface 1628 may have a surface curvature such that the inject ports 1626 penetrating through the inject insert 1620 are fluidly sealed to the plurality of liner inlets 1608. The inject insert 1620 may have an exterior surface 1630. The exterior surface 1630 may be configured to connect to one or more gas lines 1701 or other gas delivering device.

As will be discussed in more detail in FIG. 4, the inject ports 1626 and the liner inlets 1608 create inside the processing region (e.g., the processing region 112 of FIG. 1 or the processing region 1220 of FIG. 2) an outer injection zone, a middle injection zone, and an inner injection zone. The outer injection zone is coaxial with the middle injection zone and the inner injection zone. The middle injection zone is radially outward of the inner injection zone, and the outer injection zone is radially outward of the middle zone. The outer injection zone may have a first number of passages. The middle injection zone may have a second number of passages, and the second number of passages may be the same or different from the first number of passages. The inner injection zone may have a third number of passages, and the third number of passages may be the same or different from the first number of passages and/or the second number of passages. Larger substrates, due to their increased surface area, require tighter control of process parameters. Thus, by increasing the number of zones, the area that is controlled by a single zone is decreased allowing for finer tuning of process parameters.

Figure 4:
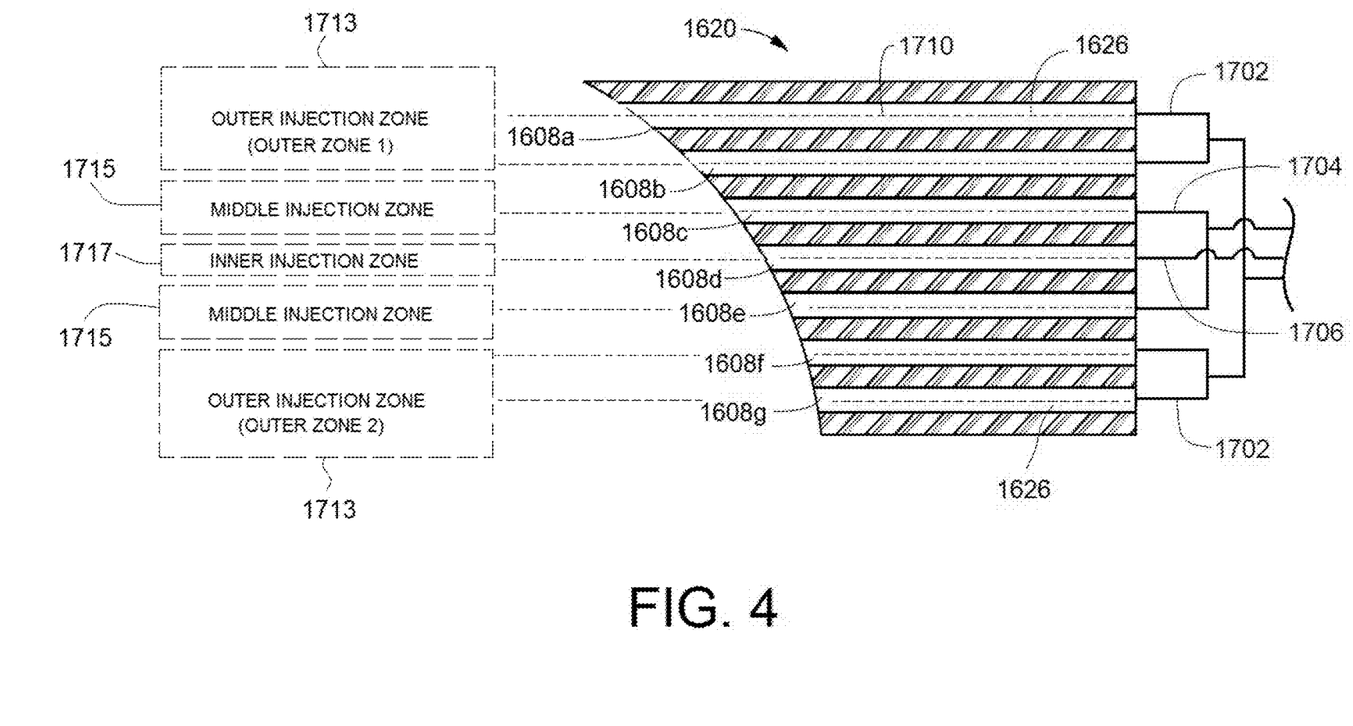
FIG. 4 depicts a cutaway overhead view of a portion of the inject insert of FIGS. 3A and 3B according to one implementation.

FIG. 4 depicts a cutaway overhead view of a portion of the inject insert 1620 of FIGS. 3A and 3B according to one implementation. The inject insert 1620 as shown has a plurality of inject ports 1626 formed therein, such as seven inject ports 1626 (only two are labeled). The inject insert 1620 can have one or more multi-connect gas lines, shown here as first multi-connect gas line 1702, second multi-connect gas line 1704 and third multi-connect gas line 1706. The first multi-connect gas line 1702, the second multi-connect gas line 1704 and the third multi-connect gas line 1706 are configured to flow gases in multiple zones into a processing region, such as the processing region 118 described with reference to FIG. 1, or the processing region 1220 described with reference to FIG. 2.

The plurality of inject ports 1626 are positioned and oriented to create multiple flow zones inside the processing region of the processing chamber. In one implementation, the first multi-connect gas line 1702 defines an outer injection zone 1713. The second multi-connect gas line 1704 defines a middle injection zone 1715. The third multi-connect gas line 1706 defines an inner injection zone 1717. The outer injection zone 1713 is radially outward of the middle injection zone 1715, and the middle injection zone 1715 is radially outward of the inner injection zone 1717. In one implementation, the outer injection zone 1713 is coaxial with the middle injection zone 1715 and the inner injection zone 1717. For a 450 mm substrate, the outer injection zone 1713 may be defined by a radial width of about 103.7 mm to about 238.5 mm, measuring from a center of the substrate support. The middle injection zone 1715 may be defined by a radial width of about 36.3 mm to about 103.7 mm, measuring from the center of the substrate support. The inner injection zone 1717 may be defined by a radial width of about 36.3 mm, measuring from the center of the substrate support. The substrate support herein may refer to the substrate support 105 shown in FIG. 1. As discussed previously, the substrate support 105 would have a diameter greater than or equal to about 450 mm. Representative diameters could be between 460 mm to 550 mm. It is contemplated that the radial width of each zone can be adjusted proportionally for a 300 mm substrate and/or the substrate support 1206 used in FIG. 2.

The multi-connect gas lines 1702, 1704 and 1706 are in connection with more than one of the plurality of inject ports 1626 (also referred to as the connected ports). The multi connect gas lines 1702, 1704 and 1706 can deliver either gases or different gases under differing conditions. In one implementation, the first multi connect gas line 1702 delivers a first gas to the connected ports, the second multi connect gas line 1704 delivers a second gas to the connected ports and the third multi connect gas line 1702 delivers a third gas to the connected ports. The first gas, the second gas and the third gas can be the same gas or different gases from one another. In another implementation, the first multi connect gas line 1702 delivers a gas to the connected ports at a first pressure and/or a first temperature, the second multi connect gas line 1704 delivers a gas to the connected ports at a second pressure and/or a second temperature, and the third multi connect gas line 1702 delivers a gas to the connected ports at a third pressure and/or a third temperature. The first pressure, second pressure and the third pressure may be the same or different from one another. As well, the first temperature, second temperature and the third temperature may be the same or different from one another. Further any number of inject ports 1726 may be connected to any number of multi-connect gas lines.

The first gas, the second gas, and the third gas may include, for example, a silicon-containing precursor gas, a germanium-containing gas, an oxygen containing gas, a hydrogen containing gas, a nitrogen-containing gas, any suitable precursor gas(es) that are suitable for forming a group IV semiconductor compound, a group II-VI semiconductor compound, or a group III-V semiconductor compound, or any suitable precursor gas(es) depending on the application. Suitable silicon-containing precursor gas may include one or more of silanes, halogenated silanes or organosilanes. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), or other higher order silane such as polychlorosilane. Halogenated silanes may include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Suitable germanium-containing gases may include, but are not limited to germane ($GeH_4$), digermane ($Ge_2H_6$), trigermane ($Ge_3H_8$), or a combination of two or more thereof.

The inject insert 1620 includes a plurality of inject inlets, shown here as seven inject inlets 1608a-1608g arranged in a linear fashion. The inject inlets 1608a-1608g may be approximately equally spaced and positioned in the inject insert 1620. The inject inlets 1608a-1608g may have a linear width which approximately equals to the radius diameter of a substrate disposed on a substrate support, such as the substrate support 105 shown in FIG. 1 or the substrate support 1206 shown in FIG. 2. The inject inlets 1608a-1608g may have a linear width which approximately equals to or larger than a diameter of a substrate disposed on a substrate support, such as the substrate support 105 shown in FIG. 1 or the substrate support 1206 shown in FIG. 2. Each of the inject inlets 1608a-1608g may have identical diameter. Alternatively, the inject inlets 1608a-1608g may have a varying diameter such that the inject inlet 1608a-1608g delivers a differing volume of gas at a proportionally changed velocity. In some implementations, the inject insert 1620 may be a multi-tier inject insert having two or more rows of inject ports 1626 arranged along the thickness of the inject insert 1620 such that gas can be delivered to the processing region more uniformly.

Though the center line 1710 is only shown with relationship to inject inlet 1608a, it is understood that each of the inject inlets 1608a-1608g has a related center line 1710 which bisects each of the respective inject ports 1626. It is contemplated that a change in size and shape can be created with full freedom of position and rotation such that the gas can be delivered in any direction and at any angle desired by the end user.

It has been unexpectedly discovered by the present inventor that the film thickness profile on a substrate can be significantly improved by opening inject inlets responsible for the middle injection 1715 and inner injection zone 1717 while blocking certain inject inlets responsible for out injection zone. Specifically, the present inventor surprisingly discovered that when the substrate is rotated along clockwise direction, turning off the inject inlets 1608a and 1608b will result in a uniform, radial symmetric thickness profile of the film on the substrate. The present inventor has observed that this phenomenon only occurs if inject inlets responsible for upper stream of the outer injection zone 1713 (labeled as "OUTER ZONE 1" in FIG. 4) are blocked. The expression "inject inlets responsible for upper stream of the outer injection zone" herein refers to inject inlets that are positioned to be closer to a substrate loading port (e.g., the loading port discussed above with respect to FIGS. 1 and 2), such as inject inlets 1608a and 1608b of the inject insert 1620. In contrast, blocking the inject inlets responsible for lower stream of the outer injection zone 1713 (labeled as "OUTER ZONE 2" in FIG. 4) may not result in a radial symmetric thickness profile of the film on the substrate. The expression "inject inlets responsible for lower stream of the outer injection zone" herein refers to inject inlets that are positioned to be further away from the substrate loading port (as compared to other inject inlets 1608a and 1608b responsible for the outer injection zone 1713), such as inject inlets 1608f and 1608g of the inject insert 1620.

Stated differently, it is understood that the outer injection zone for a 450 mm substrate is defined to cover a radial width of about 103.7 mm to about 238.5 mm (measuring from the center of the substrate support) and the substrate support may have a diameter greater than or equal to about 450 mm, for example about 460 mm to 550 mm, such as about 470 mm. Therefore, if a substrate is rotated clockwise, turning off the inject inlets responsible for upper stream of an outer injection zone covering about 55% to about 65%, for example about 60%, of the radius of the substrate support and are positioned to be closer to a substrate loading port (e.g., outer zone 1 shown in FIG. 4), while leaving inject inlets responsible for inner and middle injection zones opened, will obtain a radial symmetric thickness profile of the film on the substrate. Likewise, if the substrate is rotated counter-clockwise, turning off the inject inlets responsible for lower stream of an outer flow zone covering about 55% to about 65%, for example about 60%, of the radius of the substrate support and are positioned to be further away from the substrate loading port (e.g., outer zone 2 shown in FIG. 4), while leaving inject inlets responsible for inner and middle injection zones opened, will improve overall film uniformity profile. It should be noted that the substrate loading port described in this disclosure is angularly offset at about 90 degrees with respect to the inject inlets.

Figure 5:
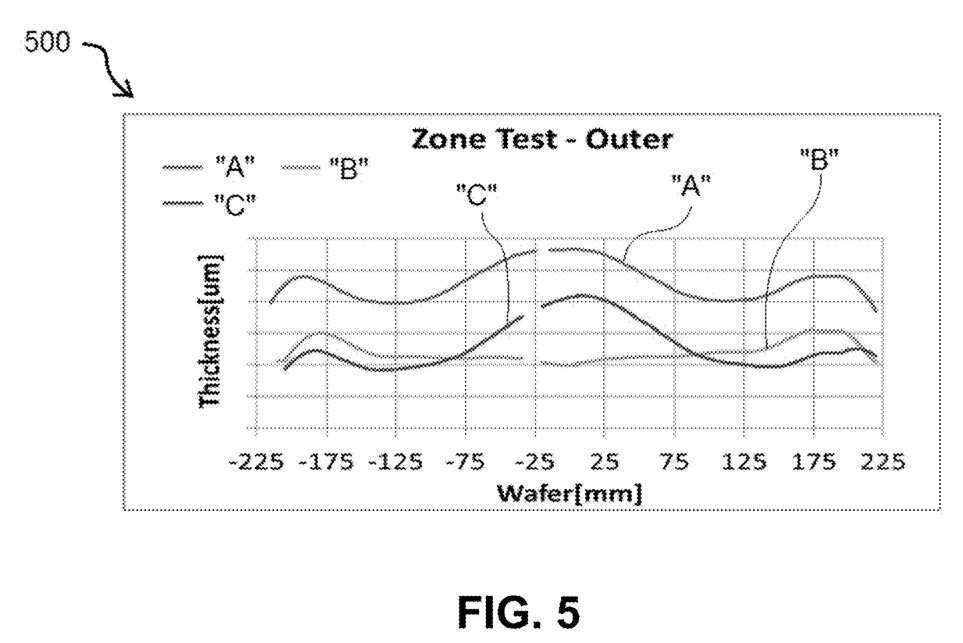
FIG. 5 is a diagram illustrating film thickness as a function of the radius of a substrate, tested using three different configurations of inject inlets.

FIG. 5 is a diagram 500 illustrating film thickness as a function of the radius of a substrate, tested using three different configurations of inject inlets. The test was performed by flowing trichlorosilane ($Cl_3SiH$, TCS) through the inject insert 1620 of FIG. 4. TCS is diluted in a hydrogen gas (30% TCS and 70% $H_2$), and the process conditions used in each configuration, including flow rate, flow ratio, temperature, pressure, rotation speed etc., are identical. In the diagram 500, line "A" represents a baseline configuration where all inject inlets 1608a-1608g of the inject insert 1620 were opened during the process. Line "B" represents a configuration 1 where the inject inlets 1608a and 1608b, which are responsible for upper stream of the outer injection zone 1713 and will first encounter a substrate rotating in a clockwise direction, were closed, while the rest of the inject inlets 1608c to 1608g were opened. Line "C" represents a configuration 2 where the inject inlets 1608f and 1608g, which are responsible for lower stream of the outer injection zone 1713 but will encounter clockwise rotational substrate later (compared to inject inlets 1608a and 1608b), were closed, while the rest of the inject inlets 1608a to 1608e were opened. As can be seen, configuration 1 shows more uniform thickness profile across the diameter of the substrate than the baseline configuration and configuration 2.

Benefits of the present disclosure include the use of a specific gas flowing scheme in an atmospheric epitaxial chamber or a heating chamber to improve film growth uniformity throughout the substrate, i.e., from the center to the edge. When the substrate is rotated along clockwise direction, it has been surprisingly observed that by creating less opening inject inlets (and thus less precursor flow) on the substrate loading port side, a more uniform, radial symmetric thickness profile of the film can be obtained as compared to having all inject inlets of an inject insert opened. Thus, through the benefits of the components described above and in combination, the epitaxial deposition chambers described in this disclosure allow for processing of larger substrates, while maintaining throughput, reducing costs and providing a reliably uniform deposition product.

While the foregoing is directed to implementations of the disclosed devices, methods and systems, other and further implementations of the disclosed devices, methods and systems may be devised without departing from the basic scope thereof, and the scope thereof is determined by the claims that follow.

The invention claimed is:

1. A method for processing a substrate in a processing chamber, comprising:
    providing the substrate onto a substrate support disposed within a processing region of the processing chamber through a substrate loading port;
    rotating the substrate in a clockwise direction; and
    flowing a gas mixture into the processing region through a gas inject insert, the gas inject insert comprising a first set of inject inlets, a second set of inject inlets, and a third set of inject inlets, wherein the third set of inject inlets comprises a first inject inlet and a second inject inlet, wherein the first inject inlet is located closer to the substrate loading port than the second inject inlet, and wherein the first inject inlet is blocked to prevent the gas mixture to flow therethrough.

2. The method of claim 1, wherein the first set of inject inlets, the second set of inject inlets, and the third set of inject inlets are arranged in a linear fashion having a width approximately equal to or larger than a diameter of the substrate.

3. The method of claim 1, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone covers about 55% to about 65% of the radius of the substrate support.

4. The method of claim 1, wherein the gas mixture comprises a halogenated silane and a hydrogen gas.

5. The method of claim 4, wherein the halogenated silane is trichlorosilane ($Cl_3SiH$).

6. A method for processing a substrate, comprising:
    providing the substrate onto a substrate support disposed within a processing region of a processing chamber through a substrate loading port;
    rotating the substrate; and
    flowing a gas mixture into the processing region through a gas inject insert, the gas inject insert comprising a first set of inject inlets, a second set of inject inlets, and a third set of inject inlets, wherein the third set of inject inlets comprises a first inject inlet and a second inject inlet, wherein the first inject inlet is located closer to the substrate loading port than the second inject inlet, and wherein the second inject inlet is blocked to prevent the gas mixture from flow therethrough.

7. The method of claim 6, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone covers about 55% to about 65% of the radius of the substrate support, and wherein the substrate is rotated in a counter-clockwise direction.

8. The method of claim 6, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone is coaxial with the middle injection zone and the inner injection zone.

9. The method of claim 6, wherein the first set of inject inlets, the second set of inject inlets, and the third set of inject inlets are arranged in a linear fashion.

10. The method of claim 9, wherein the first set of inject inlets, the second set of inject inlets, and the third set of inject inlets in combination have a width approximately equals to or larger than a diameter of the substrate.

11. The method of claim 6, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone has a radial width of about 103.7 mm to about 238.5 mm measuring from a center of the substrate support.

12. The method of claim 6, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the middle injection zone has a radial width of about 36.3 mm to about 103.7 mm measuring from the center of the substrate support.

13. The method of claim 6, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the inner injection zone has a radial width of about 36.3 mm measuring from the center of the substrate support.

14. The method of claim 6, wherein the gas mixture comprises a silicon-containing gas, a germanium-containing gas, an oxygen-containing gas, a hydrogen-containing gas, a nitrogen-containing gas, or any combination thereof.

15. The method of claim 6, wherein the gas mixture comprises a halogenated silane and a hydrogen gas.

16. The method of claim 15, wherein the halogenated silane is trichlorosilane ($Cl_3SiH$).

17. A method for processing a substrate, comprising:
providing the substrate onto a substrate support disposed within a processing region of a processing chamber;
rotating the substrate; and
flowing a gas mixture into the processing region through a gas inject insert, the gas inject insert comprising a first set of inject inlets, a second set of inject inlets, and a third set of inject inlets, and wherein an upstream inject inlet of the third set of inject inlets that is upstream of a downstream inject inlet of the third set of inject inlets is blocked to prevent the gas mixture from flow therethrough, wherein the upstream inject inlet and the downstream inject inlet are defined by a rotation direction of the rotating substrate.

18. The method of claim 17, wherein the first set of inject inlets are positioned to create an inner injection zone inside the processing region, the second set of inject inlets are positioned to create a middle injection zone that is radially outward of the inner injection zone, and the third set of inject inlets are positioned to create an outer injection zone that is radially outward the middle injection zone, wherein the outer injection zone covers about 55% to about 65% of the radius of the substrate support.

19. The method of claim 17, wherein the gas mixture comprises a halogenated silane and a hydrogen gas.

20. The method of claim 17, wherein the first set of inject inlets, the second set of inject inlets, and the third set of inject inlets in combination have a width approximately equals to or larger than a diameter of the substrate.

* * * * *